United States Patent
Linebarger et al.

[11] Patent Number: 6,141,394
[45] Date of Patent: Oct. 31, 2000

[54] FRACTIONAL-N FREQUENCY SYNTHESIZER WITH JITTER COMPENSATION

[75] Inventors: Daniel J. Linebarger, Saratoga; Rainer Gaethke, Mountain View, both of Calif.

[73] Assignee: Philips Electronics North America Corporation, New York, N.Y.

[21] Appl. No.: 08/994,826

[22] Filed: Dec. 22, 1997

[51] Int. Cl.$^7$ .................................................. H03D 3/24
[52] U.S. Cl. ........................... 375/376; 375/374; 327/157
[58] Field of Search ................... 375/374–375, 375/376, 371; 327/156, 157, 146–148; 331/1 R, 1 A, 25, 16; 364/718.02

[56] References Cited

U.S. PATENT DOCUMENTS

| | | | |
|---|---|---|---|
| 4,179,670 | 12/1979 | Kingsbury | 331/10 |
| 4,609,881 | 9/1986 | Wells | 331/1 A |
| 4,679,005 | 7/1987 | Tatami | 331/16 |
| 4,816,774 | 3/1989 | Martin | 331/1 A |
| 5,038,120 | 8/1991 | Wheatley et al. | 332/128 |
| 5,180,993 | 1/1993 | Dent | 331/16 |
| 5,349,613 | 9/1994 | Dijkhof | 375/376 |
| 5,436,596 | 7/1995 | Folmer | 331/1 A |
| 5,455,840 | 10/1995 | Nakauchi et al. | 375/371 |
| 5,475,718 | 12/1995 | Rosenkranz | 375/376 |
| 5,485,125 | 1/1996 | Dufour | 331/17 |
| 5,495,206 | 2/1996 | Hietala | 331/1 A |
| 5,651,035 | 7/1997 | Tozun et al. | 375/373 |
| 5,847,611 | 12/1998 | Hirata | 331/1 A |
| 5,987,085 | 11/1999 | Anderson | 375/374 |
| 6,031,402 | 2/2000 | Wang et al. | 327/157 |
| 6,064,272 | 5/2000 | Rhee | 331/16 |

FOREIGN PATENT DOCUMENTS

| 1560233 | 1/1980 | United Kingdom | H03L 7/18 |
|---|---|---|---|

OTHER PUBLICATIONS

"Fractional–N PLL Provides Fast, Low–Noise Synthesis", Wing S. Djen and Daniel Linebarger, Mi May 1994.
SA8025A, in Philips Semiconductors Data Handbook IC–17, 1996.

*Primary Examiner*—Stephen Chin
*Assistant Examiner*—Lenny Jiang
*Attorney, Agent, or Firm*—Peter Verdonk; Robert McDermott

[57] ABSTRACT

A fractional-N frequency synthesizer has a VCO with an output for supplying an output signal of a particular frequency, and an input for receipt of a control signal for controlling the operation of the VCO so that it locks in on a reference frequency. Compensation circuitry is coupled to the input for compensating the output signal for phase jitter. The compensation circuitry has a charge pump that supplies a compensation current to the input. The timing is derived from the output signal, thus rendering the compensation current independent of the frequency range of the VCO and of the reference frequency.

5 Claims, 3 Drawing Sheets

FRACTIONAL-N FREQUENCY SYNTHESIZER WITH JITTER COMPENSATION

FIELD OF THE INVENTION

The invention relates to an electronic device that has a fractional-N frequency synthesizer with compensation circuitry to compensate for phase jitter. The device comprises, e.g., an integrated circuit or a digital communication apparatus. The invention also relates to a method of compensating phase jitter in a fractional-N frequency synthesizer.

BACKGROUND ART

A frequency synthesizer creates multiple output signals, each with a different frequency, from a reference signal that has a highly stable reference frequency. The reference signal is generated by a crystal oscillator. Typically, a synthesizer comprises a voltage controllable oscillator (VCO) in a phase-locked-loop (PLL). The PLL controls the oscillator to keep the frequency and phase of the oscillator's output signal locked to those of the reference signal. The PLL has a phase detector to compare the phase of the oscillator's output signal with the phase of the reference signal. The detector controls a charge pump that supplies an error signal to the VCO in proportion to the phase difference detected. If the phase difference is zero, the pump provides a zero error signal. The PLL has a low-pass filter between the output of the pump and the control input of the VCO. The filter's task is to remove high-frequency contributions, e.g., noise, from the error signal that otherwise would modulate the VCO's frequency. If the bandwidth of the filter is made smaller, the PLL's noise performance is increased. However, lowering the bandwidth also increases the settling time that is needed for the PLL to lock in on the reference signal. Typically, the output frequency is divided by an integer factor N prior to carrying out phase comparison with the reference frequency. The division enables comparing frequencies that have similar values. The factor N can be made variable to provide a plurality of different output frequencies, e.g., for switching between channels in a communication device. The divider is usually implemented with a counter. Therefore, the factor N is an integer. The resolution in the divided output frequency equals the reference frequency. The resolution can be made finer by using a lower reference frequency. However, the error signal supplied by the phase detector follows then the detected phase difference more slowly. In addition, the low-pass filter then has to have a lower cut-off frequency that increases the settling time as mentioned above.

The fractional-N frequency synthesis provides a solution to this conflict between fine resolution and settling time. Frequency synthesizers with a PLL and a fractional-N division are discussed in, e.g., U.K. patent 1,560,233 and in "Fractional-N PLL Provides Fast, Low-Noise Synthesis", Wing S. Djen and Daniel Linebarger, Microwaves & RF, May 1994. Fractional-N division generates an output frequency whose ratio with the reference frequency is not an integer. A programmable frequency divider is located between the VCO and the phase detector, and the divide factor is switched between N and N+1 on a proportion x of the VCO's cycles giving on the average a division ratio close to N+x. Fractional-N division in a frequency synthesizer helps to obtain a good frequency resolution, which is specially important in digital cellular standards.

The fractional divide process causes variations in the period of the waveform at the output of the programmable divider. Division by N+1 requires one more input cycle than dividing by N. The result is a periodic phase error that causes corresponding side bands (fractional spurs) in the VCO's output spectrum. In other words, the output of the divider is modulated with a fractional phase ripple as a result of the periodically changing division ratios. This ripple causes phase jitter in the VCO's output signal. This jitter is the short-term variations of the significant instants of the VCO's output signal from their ideal positions in time.

U.K. patent 1,560,233, mentioned above and herewith incorporated by reference, teaches mitigating the jitter effects using voltage compensation. An analog compensation voltage is generated, which is added to the output voltage of the phase comparator at the input of the loop filter. This is achieved as follows. The known synthesizer comprises an accumulator whose capacity is referred to as fractional modulus and whose content gets increased by a certain fractional increment every time the programmable divider supplies an output pulse. Assume that the accumulator is set to zero. Every N cycles of the VCO the divider supplies an output pulse in response to which the fractional increment is being added to the content of the accumulator. When the accumulator overflows, i.e., has reached the fractional modulus, the dividing factor is changed to N+1. The dividing factor is reset to N after the divider has supplied its next output pulse. Accordingly, the fraction x is equal to the reciprocal of the integer number of times the fractional increment fits into the fractional modulus. Although, on the average, the frequency division by a factor N+x is correct, the instantaneous phase of the VCO's output signal is not constant. The input to the phase detector representing the VCO's output signal divided by N advances on the reference signal and produces a ramp error in the phase difference. This ramp causes the jitter at the VCO's output. The content of the accumulator is proportional to this phase difference and, if scaled properly, converted to a voltage and subtracted from the error signal supplied by the phase detector, compensates to some degree for the jitter.

Low-voltage 2GHz fractional-N synthesizer SA8025A of Philips Semiconductors, a division of Philips Electronics N.V., uses fractional current compensation. See Philips Semiconductors Data Handbook IC-17, 1996 for more details. The induced jitter is considered an amount of charge $Q_{JITTER}$ taken from the low-pass filter and proportional to:

$$Q_{JITTER} \; I_{PUMP}/[F_{VCO} * F_{MOD}], \quad (1)$$

wherein: $I_{PUMP}$ is the value of the main charge pump current; $F_{VCO}$ is the VCO's frequency, and FMOD is the fractional modulus (a dimensionless quantity). Compensation is achieved by supplying a compensation charge Qcomp timed by the reference frequency FREF according to the proportionality relationship:

$$Q_{COMP} \; I_{COMP}/F_{REF}, \quad (2)$$

wherein $I_{COMP}$ is the magnitude of the compensation current. Combining expressions (1) and (2) gives as a result for the compensation current:

$$I_{COMP} \; [I_{PUMP} * F_{REF}]/[F_{VCO} * F_{MOD}]. \quad (3)$$

Consequently, the operation of the pump producing the compensation current depends on the reference frequency $F_{REF}$, and on the frequency $F_{VCO}$ of the VCO's output signal.

OBJECT OF THE INVENTION

The known current compensation scheme functions well, but depends on the chosen reference frequency and on the frequency at which the VCO is supposed to operate. This demands that the compensating pump producing the compensation current is required to operate over a range of current densities that depends on the chosen frequencies. In other words, the compensation pump is to be redesigned for each individual frequency range in order to provide optimum performance. It is an object of the present invention to provide a system with a fractional-N frequency synthesizer whose compensation circuitry renders the synthesizer suitable for a wider range of frequencies than that of the known synthesizers.

SUMMARY OF THE INVENTION

The invention provides an electronic device with a fractional-N frequency synthesizer. The synthesizer has a VCO with an output for supplying an output signal of a particular frequency, and an input for receipt of a control signal for controlling the operation of the VCO. The synthesizer has compensation circuitry coupled to the input to compensate the output signal for phase jitter and comprising a charge pump for supplying a compensation current to the input and whose timing is derived from the output signal. The timing for the compensation charge is derived from the VCO's frequency, preferably substantially inversely proportional to the VCO's frequency Fvco according to:

$$Q_{COMP} I_{COMP}/F_{VCO},\quad (4)$$

Now, combining the right hand sides of formulae (1) and (4) gives:

$$I_{COMP} I_{PUMP}/F_{MOD}.\quad (5)$$

The result is that the compensation current in the invention is independent of the frequency range of the VCO and of the reference frequency. This approach renders the synthesizer of the invention highly suitable for use as a modular building block. Note that in the low-voltage 2GHz fractional-N synthesizer SA8025A, mentioned above, the timing is derived from the reference frequency, and that therefore, each frequency range requires an individual optimization of the compensation current source.

BRIEF DESCRIPTION OF THE DRAWINGS

The invention is explained by way of example and with reference to the accompanying drawings, wherein.

Throughout the figures, same reference numerals indicate similar or corresponding features.

PREFERRED EMBODIMENTS

Figure 1:
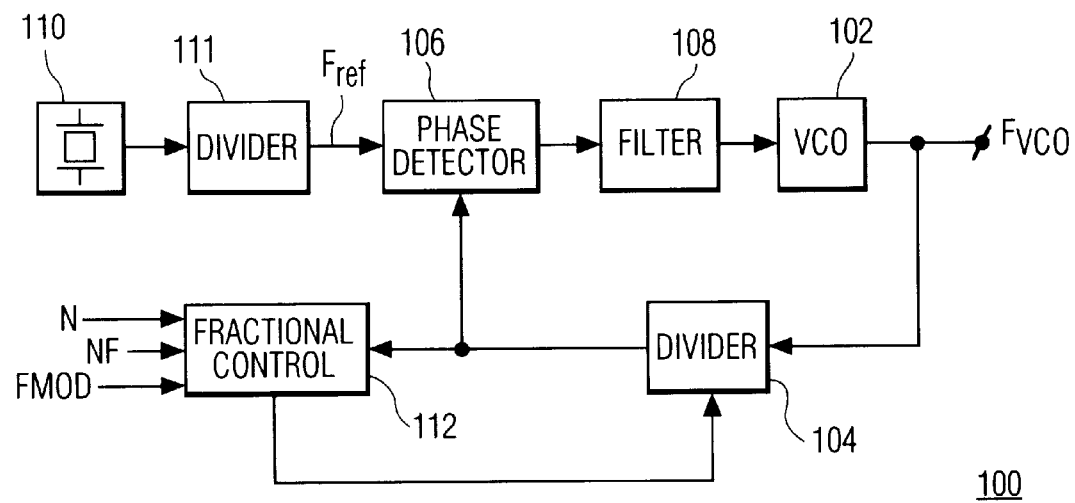
FIG. 1 is a block diagram of a fractional-N synthesizer.

FIG. 1 is a block diagram of a typical fractional-N synthesizer 100. Synthesizer 100 comprises a VCO 102, a programmable frequency divider 104, a phase detector 106 and a lowpass loop filter 108. An output of VCO 102 supplies an output signal with frequency $F_{VCO}$. Divider 104 is connected to the output of VCO 102 and supplies a signal with the divided frequency to detector 106. A reference signal with a reference frequency $F_{REF}$ is supplied to detector 106 here derived from a crystal oscillator 110 via a second divider 111. Detector 106 supplies an error signal to VCO 102 via loop filter 108. Typically, the phase detector comprises a charge pump (not shown) driven in a conventional manner for charging or discharging the capacitance of the control input of VCO 102. See, for example, the low-voltage 2GHz fractional-N synthesizer SA8025A described in Philips Data Handbook IC-17 mentioned above. The charge pump includes current sources that supply or sink an amount of charge typically proportional to the phase difference detected. For more details on known charge pumps and phase detectors see, for example, U.S. Pat. No. 5,485,125; U.S. Pat. No. 5,475,718; U.S. Pat. No. 5,436,596; and U.S. Pat. No. 5,349,613; herewith incorporated by reference.

As known in the field of fractional-N synthesizers, divider 104 alternately divides frequency $F_{VCO}$ by a factor N and a factor N+1, wherein N is an integer. Division by non-integer values is achieved on the average by dividing by N+1 instead of by N for a fraction of the time. To this end, the synthesizer has a fractional controller 112 for control of divider 104. In this example, fractional controller 112 is programmable with respect to the division N of programmable divider 104, the fractional modulus FMOD and the fractional increment NF, further explained below.

Figure 2:
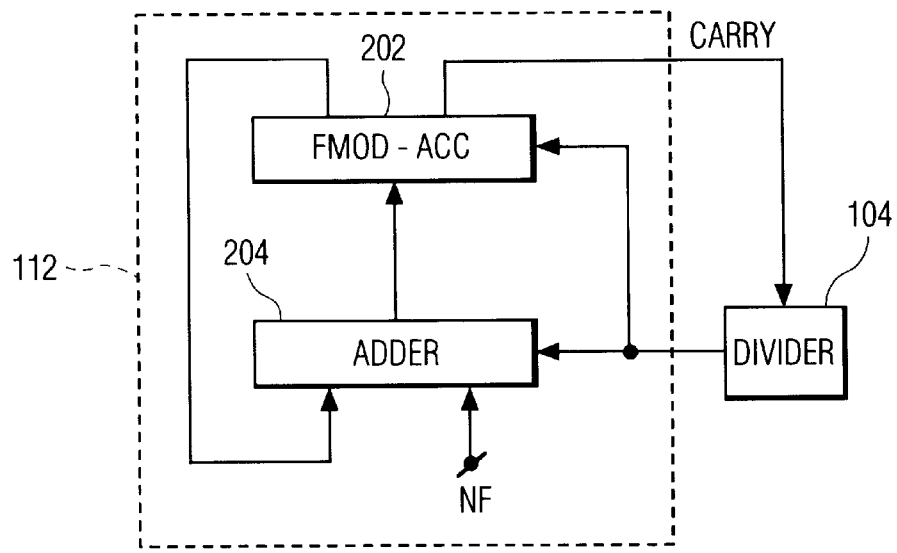
FIG. 2 is a block diagram of a portion of the fractional controller in the synthesizer.

FIG. 2 shows a part of a controller 112. Controller 112 comprises a modulo-FMOD accumulator 202 and an adder 204. The capacity of accumulator 202 is referred to as the fractional modulus or FMOD. Accumulator 112 stores a digital word whose value in digital representation can have a value up to the fractional modulus FMOD. In response to a pulse supplied by divider 104, adder 114 increments the content of accumulator 112 by a fractional increment NF. When accumulator 112 overflows it creates a carry signal. The carry signal is supplied to divider 104.The presence or absence of the carry signal then determines whether the dividing factor of divider 104 is set to N+1 or to N.

The digital value contained in accumulator 112 is representative of the phase difference between the divided output signal of VCO 102 and the reference signal with frequency $F_{REF}$. The divided signal of VCO 102 advances every cycle on the reference signal by an amount proportional to $1/F_{MOD}$. Hence, the charge taken from filter 108 is given by expression (1) introduced above:

$$Q_{JITTER} I_{PUMP}/[F_{VCO}*F_{MOD}].\quad (1)$$

The phase jitter is the manifestation of this undesired flow of charge $Q_{JITTER}$ In the invention, the phase jitter is compensated for by supplying a compensation charge $Q_{COMP}$, now according to expression (4) above:

$$Q_{COMP} I_{COMP}/F_{VCO}\quad (4)$$

Accordingly, the compensation pump must supply a current $I_{COMP}$ proportional to:

$$I_{COMP} I_{PUMP}/F_{MOD}.\quad (5)$$

The advantages over the known compensation scheme have already been mentioned above.

Figure 3:
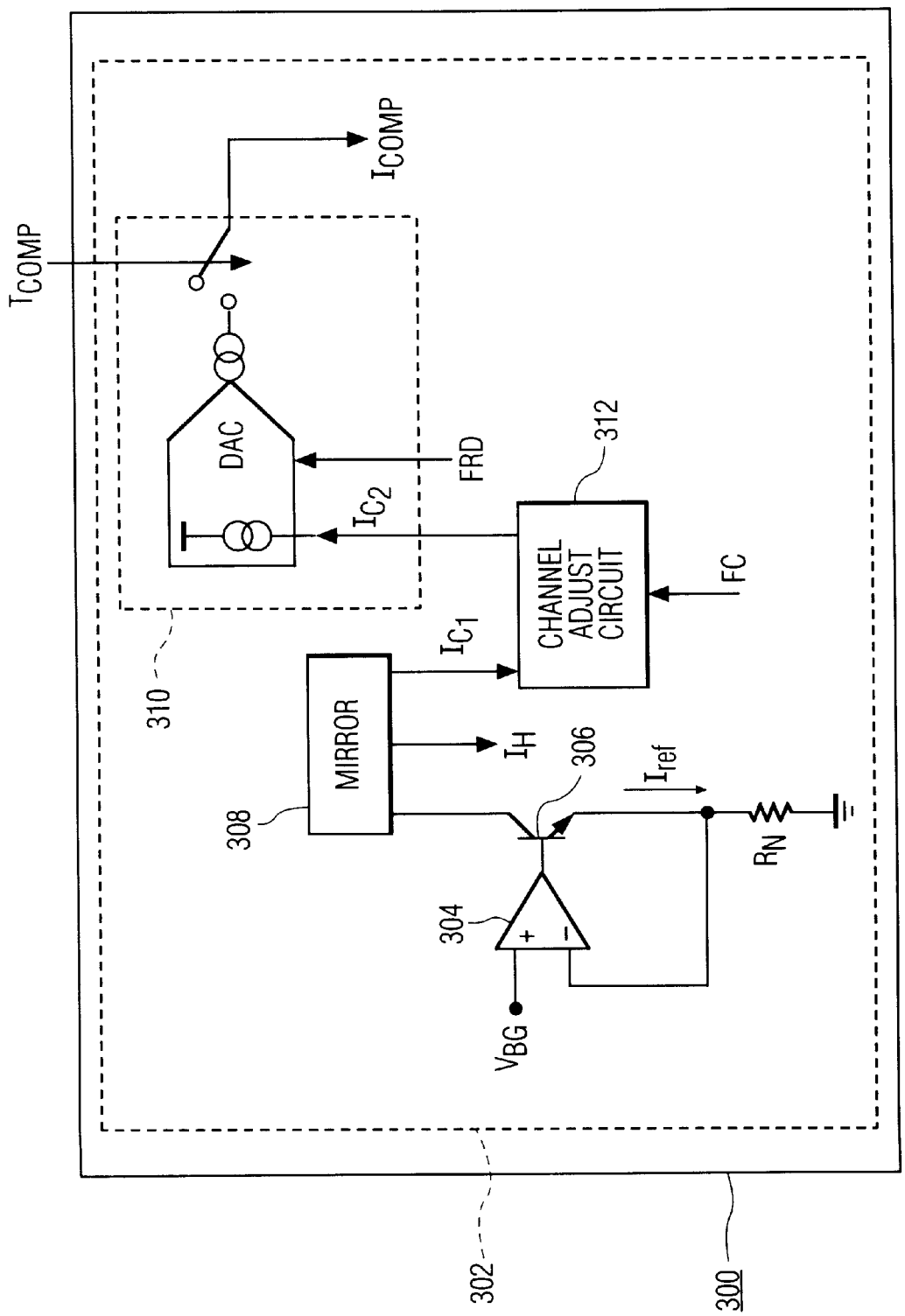
FIG. 3 is a block diagram of a controlled compensation charge pump in the invention.
Figure 4:
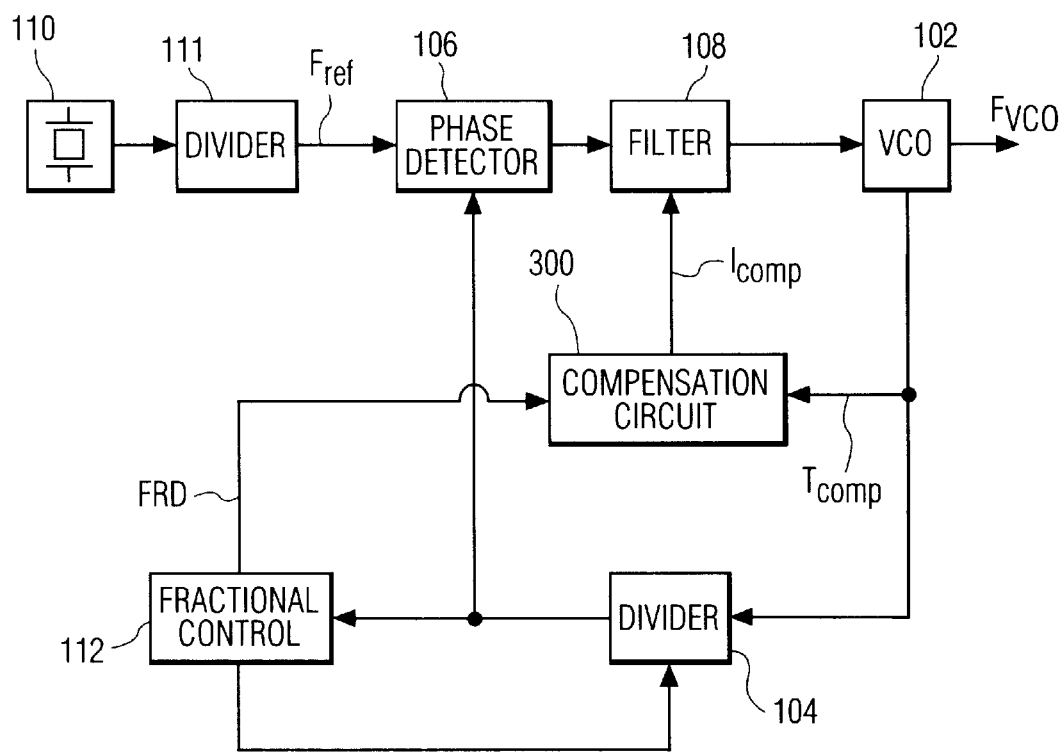
FIG. 4 illustrates an example block diagram of a fractional-N synthesizer in accordance with this invention.

FIG. 3 is a block diagram of a portion of synthesizer 300 according to the invention and integrated in a digital communication device for use in, e.g., the GSM system (Global System for Mobile, Pan European Cellular), or ADC (American Digital Cellular). Synthesizer 300 comprises a circuit 302 that has a generator for generating a reference current $I_{ref}$. The generator in this example has a differential amplifier 304 that controls a transistor 306 so that a voltage across a reference resistor $R_N$ is kept equal to a reference voltage $V_{BG}$. The reference current $I_{ref}$ defined hereby is mirrored and scaled through a current mirror 308. Mirror 308 has a first output that supplies a first output current $I_M$ that is used to scale the current delivered by the main charge pumps (not shown), and a second output current $I_{C1}$ that is used to scale the current $I_{COMP}$ supplied by compensation charge pump 310. In this example, current $I_{C1}$ is supplied to a circuit 312 that scales its output current $I_{C2}$ under control of a digital signal FC that enables adjustment of the fractional compensation for each individual frequency channel in the digital communications system. Circuit 312 is optional to improve overall performance. Current $I_{C2}$ is supplied to pump 310 that scales current $I_{C2}$ under control of a digital signal FRD representing the momentary content of accumulator 202. This determines the amplitude of the pump's current pulse. Pump 310 receives a timing signal $T_{COMP}$ derived from the signal at the output of VCO 102, as illustrated in FIG. 4. That is, timing signal $T_{COMP}$ runs synchronously with the VCO's output signal. Circuits 310 and 312 function as digitally controllable current sources. A digitally controllable current source comprises, for example, a parallel arrangement of multiple current sources that are on or off depending on the binary signal at their respective control electrodes. A digital word in a register is thus mapped onto a pattern of on and off sources and controls, therefore, the magnitude of the aggregate output currents $I_{C2}$ and $I_{COMP}$

We claim:

1. An electronic device with a fractional-N frequency synthesizer comprising:

a VCO with an output for supplying an output signal of a particular frequency, and an input for receipt of a control signal for controlling the operation of the VCO;

a divider, operably coupled to the VCO, that is configured to divide the particular frequency of the output signal by a controllable divisor to produce a feedback signal, a fractional controller, operably coupled to the divider, that is configured to control the controllable divisor;

a phase detector, operably coupled to the divider, that is configured to compare the feedback signal with an other signal to produce an error signal;

a filter, operably coupled to the phase detector, that is configured to receive the error signal and to provide the control signal for controlling the operation of the VCO;

compensation circuitry comprising a charge pump operably coupled to the filter and the VCO, that is configured to supply a compensation current that is synchronous with the output signal, for compensating the output signal for phase jitter.

2. The device of claim 1, wherein the fractional controller includes a modulo accumulator, and wherein the compensation circuitry further comprises:

a first input for receiving a content signal representative of a content of the accumulator for control of an amplitude of a current pulse supplied by the charge pump; and a second input for receiving a timing signal representative of the VCO's output signal for enabling synchronization of the charge pump to the output signal.

3. The device of claim 2, wherein the compensation circuitry further comprises a third input for receiving a control signal for adjusting the amplitude of the current pulse in dependence on a selected frequency range of the VCO.

4. The device of claim 1, wherein the compensation current is also dependent upon an output of the fractional controller.

5. A method of compensating a fractional-N frequency synthesizer for fractional jitter, comprising:

providing an output signal of a particular frequency in dependence upon a control signal, dividing the particular frequency of the output signal by a controllable divisor to provide a feedback signal, accumulating a fractional accumulation in dependence upon the feedback signal, determining the controllable divisor based on the fractional accumulation, determining an error signal based on a phase difference between the feedback signal and an input signal, determining a compensation signal that is synchronous with the output signal, and determining the control signal based on the error signal and the compensation signal.

* * * * *